(12) United States Patent
Park et al.

(10) Patent No.: US 6,380,615 B1
(45) Date of Patent: Apr. 30, 2002

(54) CHIP SIZE STACK PACKAGE, MEMORY MODULE HAVING THE SAME, AND METHOD OF FABRICATING THE MODULE

(75) Inventors: Sang Wook Park; Jae Myun Kim, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 22 days.

(21) Appl. No.: 09/604,091

(22) Filed: Jun. 27, 2000

(30) Foreign Application Priority Data

Jun. 29, 1999 (KR) .............................. 99-25252

(51) Int. Cl.⁷ .................. H01L 23/02; H01L 23/495
(52) U.S. Cl. ................ 257/686; 257/685; 257/787; 257/666; 257/723
(58) Field of Search ............................. 257/685, 686, 257/787, 666, 691, 723

(56) References Cited

U.S. PATENT DOCUMENTS

| 5,010,445 A | | 4/1991 | Weinold | ................ 361/392 |
| 5,508,565 A | * | 4/1996 | Hatakeyama et al. | ....... 257/777 |
| 5,877,478 A | * | 3/1999 | Ando | ................ 257/777 |
| 6,014,316 A | | 1/2000 | Eide | ................ 361/735 |
| 6,028,352 A | | 2/2000 | Eide | ................ 257/686 |
| 6,190,944 B1 | * | 2/2001 | Choi | ................ 438/109 |
| 6,303,981 B1 | * | 10/2001 | Moden | ................ 257/666 |

FOREIGN PATENT DOCUMENTS

EP  0 461 639 A2 *  6/1991  ................ 257/686

* cited by examiner

*Primary Examiner*—Jhihan B. Clark
(74) *Attorney, Agent, or Firm*—Pillsbury Winthrop, LLP

(57) ABSTRACT

Disclosed are a chip size stack package, a memory module having the same and a method for fabricating the memory module. In the chip size stack package, two semiconductor chips are arranged in a manner such that their surfaces on which bonding pads are formed, are opposed to each other at a predetermined interval. Insulating layers are applied to the surfaces of the semiconductor chips on which surfaces the bonding pads are formed, in a manner such that the bonding pads are exposed. Metal traces are respectively deposited on the insulating layers and connected to the bonding pads. Solder balls electrically connect the metal traces with each other. One ends of metal wires are bonded to a side of one of the metal traces. Both sides of the semiconductor chips and a space between them are molded by an encapsulate, in a manner such that the other ends of the metal wires are exposed.

11 Claims, 10 Drawing Sheets

CHIP SIZE STACK PACKAGE, MEMORY MODULE HAVING THE SAME, AND METHOD OF FABRICATING THE MODULE

BACKGROUND OF THE INVENTION

1. Field of the Invention

The present invention relates to a chip size stack package, a memory module having the chip size stack package and a method for fabricating the memory module, and more particularly, the present invention relates to a stack package in which at least two semiconductor chips are stacked to accomplish a size substantially corresponding to that of the conventional semiconductor chip, a memory module having mounted thereon the stack package, and a method for fabricating the memory module.

2. Description of the Related Art

Nowadays, the increase in a capacity of a memory chip is undergoing rapid progress. In this regard, while a 128M DRAM is currently produced in large quantities, a 256M DRAM will instead be mass-produced in the near future.

As a method for increasing a capacity of a memory chip, i.e., for rendering a high integration rate, a technique of inserting more cells into a preset area of a semiconductor device, is disclosed in the art. However, it takes a lengthy period of time to develop such technique, and the technique requires a high precision with respect to forming a line width, etc. To cope with these problems, recently, a stacking technique which enables a high integration rate to be realized in a simpler manner, has been vigorously developed.

The term, "stacking" which is used in the semiconductor industry, means a method of doubling a capacity of a memory chip by heaping up at least two semiconductor chips in a vertical direction. By the stacking technique, for instance, and a 128M DRAM device can be constituted by two 64M DRAM devices and a 256M DRAM device can be constituted by two 128M DRAM devices.

Referring to FIG. 1, there is shown a typical example of stack packages which are produced using the stacking technique. As shown in FIG. 1, inner leads of a lead frame 11 are attached, using an adhesive, to a semiconductor chip 10 on an upper surface of which bonding pads are located. The inner leads are connected to the bonding pads through metal wires 12. The entire structure is molded by an encapsulate 13 in a manner such that outer leads of the lead frame 11 are exposed at sides of the semiconductor chip 10.

On the package constructed as just mentioned above, there is stacked another package having the same construction. In other words, outer leads of the upward positioned package are coupled to a middle portion of the lead frame of the downward positioned package, whereby an electrical connection between two packages is effected.

However, the stack package according to the conventional art suffers from defects in that a thickness of the entire stack package is increased. Moreover, since a signal must be transmitted from the outer leads of the upper package through the lead frame of the lower package, a signal transmitting path is overly lengthened. Furthermore, due to the fact that the leads of the upper and lower packages are coupled to each other by means of soldering, an inferior connection may result from an improper soldering.

To solve these defects, another conventional stack package as shown in FIG. 2 is disclosed in the art. As shown in FIG. 2, upper and lower semiconductor chips 1a and 1b having surfaces on which bonding pads are formed, are arranged in a manner such that the surfaces thereof are opposed to each other at a predetermined interval. Upper and lower lead frames 2a and 2b are bonded to the respective surfaces of the upper and lower semiconductor chips 1a and 1b on which surfaces the bonding pads are formed, and inner leads of the upper and lower lead frames 2a and 2b are electrically connected to the bonding pads by metal wires 3a and 3b. On the other hand, an outer end of the upper lead frame 2a is bonded to a middle portion of the lower lead frame 2b. The resultant structure is molded by an encapsulate 4 in a manner such that only outer leads of the lower lead frame 2b are exposed.

Nevertheless, the conventional stack package as shown in FIG. 2 still encounters drawbacks as described below. First, while a signal transmitting path is shortened, due to the fact that two metal wires each of which conducts a signal transmitting function, too closely adjoin to each other, a likelihood of signal interference to occur is increased when the upper and lower semiconductor chips are simultaneously driven.

Also, while a connection technique using a laser is employed in order to electrically connect the respective lead frames with each other, this technique induces a drawback in that the laser connection has semi-permanency. Consequently, if a flaw is caused in one semiconductor chip, two semiconductor chips should be discarded together.

In addition, because the respective semiconductor chips are completely molded by the encapsulate, heat dissipation cannot be effectively executed while the upper and lower semiconductor chips are driven. That is to say, since a heat sink cannot be adequately installed, heat dissipation cannot be implemented in a sufficient manner.

SUMMARY OF THE INVENTION

Accordingly, the present invention has been made in an effort to solve the problems occurring in the related art, and a primary object of the present invention is to provide a chip size stack package which prevents signal interference from being generated and shortens a signal transmitting path.

Another object of the present invention is to provide a chip size stack package in which an electrical signal connection between stacked semiconductor chips is realized through a simple process without using costly laser equipment.

Another object of the present invention is to provide a chip size stack package in which respective semiconductor chips are coupled with each other in such a way as to be capable of being easily detached from each other, whereby it is possible to prevent the chip size stack package from being discarded as a whole when a flaw is induced in one semiconductor chip.

Still another object of the present invention is to provide a chip size stack package which enables a heat sink to be attached to a board, whereby a heat dissipation characteristic is improved.

Yet still another object of the present invention is to provide a memory module having the chip size stack package and a method for fabricating the memory module.

In order to achieve the above objects, a chip size stack package according to the present invention is constructed as described below.

Two semiconductor chips are arranged in a manner such that their surfaces on which bonding pads are formed, are opposed to each other at a predetermined interval. Insulating layers are applied to the surfaces of the semiconductor chips on which surfaces the bonding pads are formed, in a manner such that the bonding pads are exposed. Metal traces are respectively deposited on the insulating layers and connected to the bonding pads. Solder balls electrically connect the metal traces with each other. One ends of metal wires are bonded to a side of one of the metal traces. Both sides of the semiconductor chips and a space between them are molded by an encapsulate, in a manner such that the other ends of the metal wires are exposed.

A memory module having the chip size stack package as described above is constructed as stated below.

A first recess having a size capable of receiving one semiconductor chip is defined on a first surface of a board on which surface electrode pads are formed. An adhesive is applied to an inner wall of the board which inner wall defines the first recess. One semiconductor chip of the stack package constructed as mentioned above is received in the first recess and bonded to the inner wall of the board by the adhesive. The other ends of the metal wires are bonded to the electrode pads, respectively, and an encapsulate molds connection regions of the outside connection terminals, the first recess and a space between the upper and lower semiconductor chips.

A method for fabricating the memory module having the above-stated construction, is implemented as given below.

After an insulating layer is applied on a surface of a wafer which has a plurality of semiconductor chips, the insulating layer is etched, whereby bonding pads of individual semiconductor chip are exposed. Then, after a metal layer is deposited on the insulating layer, the metal layer is patterned, and thereby, a metal trace which is connected to the bonding pads, is formed. Thereupon, the wafer is cut along a scribe line, and thereby, the wafer is divided into respective semiconductor chips.

On the other hand, a first recess having a size capable of receiving one semiconductor chip is defined on a first surface of a board on which surface electrode pads are formed. After one semiconductor chip is received in the first recess and bonded to an inner wall of the board which inner wall defines the first recess, the electrode pads of the board and one of the metal traces are electrically connected with each other through metal wires, respectively. Several solder balls are mounted to the metal trace of the other semiconductor chip. The solder balls are also mounted to the metal trace of the one semiconductor chip which is bonded to the inner wall of the board which inner wall defines the first recess, whereby the two semiconductor chips are staked one upon the other. Finally, sides of the resultant structure, the first recess and a space between the two semiconductor chips are molded by an encapsulate, in a manner such that a surface of the upper semiconductor chip is exposed.

By the features of the present invention, since metal traces are used in place of lead frames, signal interference is minimized. Also, due to the fact that lead frames are not used, costly laser equipment for connecting lead frames is not needed. Moreover, because an encapsulate molds only sides of stacked semiconductor chips, by removing the encapsulate from the sides of the stacked semiconductor chips, the stacked semiconductor chips can be easily detached from each other. Furthermore, by the fact that a surface of the semiconductor chip is exposed from the encapsulate, a heat sink can be attached thereto. More particularly, as the two semiconductor chips having the same thermal expansion rate are arranged while being centered on the solder balls, mounting intensity of the solder balls is increased.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
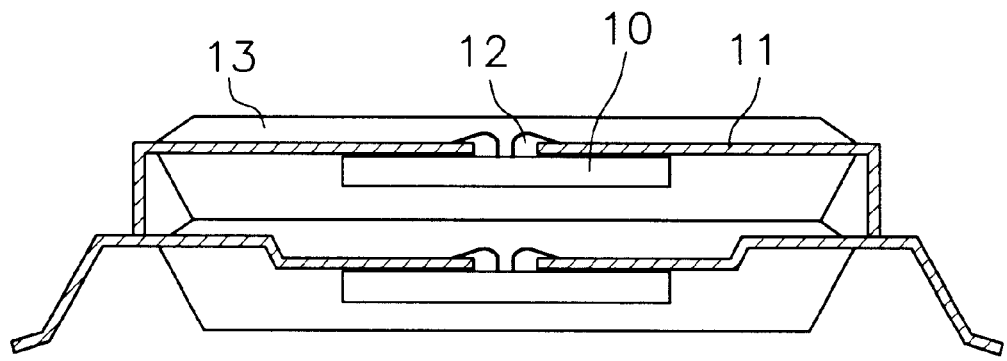
FIGS. 1 and 2 are cross-sectional views respectively illustrating the conventional stack packages.
Figure 2:
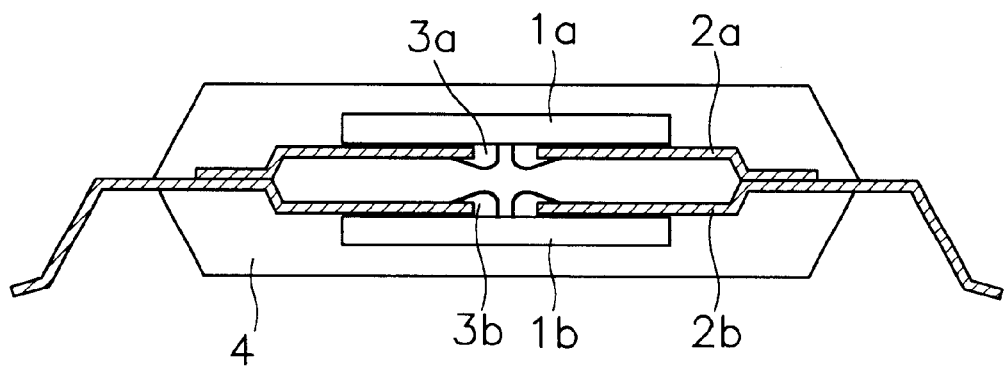

Reference will now be made in greater detail to a preferred embodiment of the invention, an example of which is illustrated in the accompanying drawings. Wherever possible, the same reference numerals will be used throughout the drawings and the description to refer to the same or like parts.

Embodiment 1

FIGS. 3 through 13 are views illustrating, in regular sequence, fabricating processes of a chip size stack package and a memory module in accordance with a first embodiment of the present invention.

Figure 3:
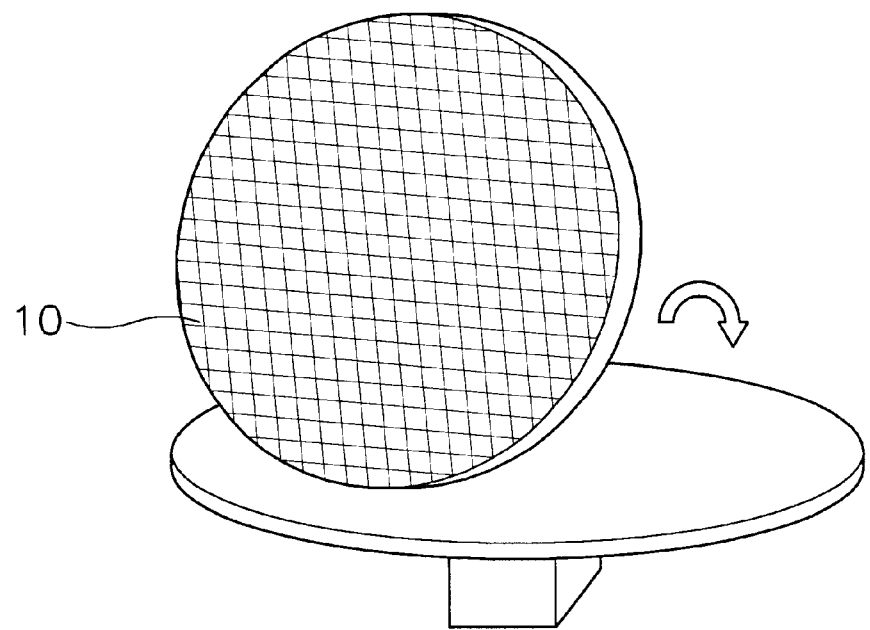
FIGS. 3 through 13 are views illustrating, in regular sequence, fabricating processes of a chip size stack package and a memory module in accordance with a first embodiment of the present invention.
Figure 4:
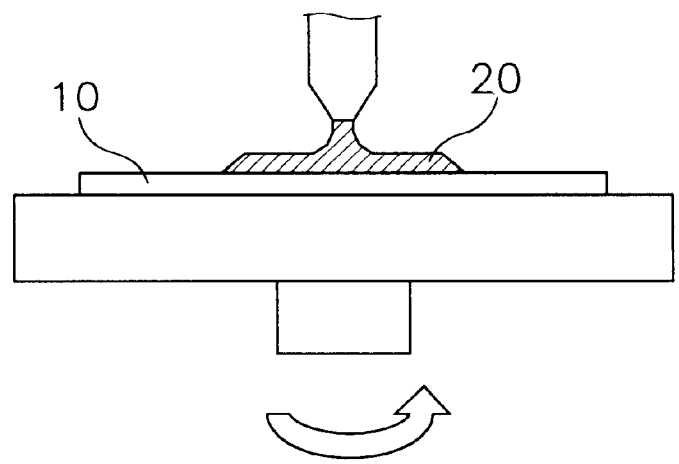
Figure 5:
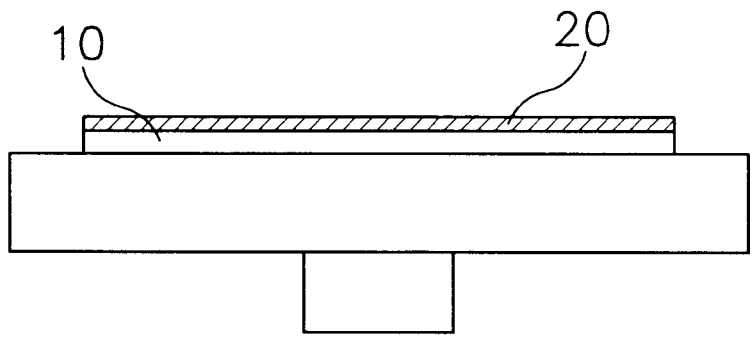

First, as shown in FIG. 3, a wafer 20 having a plurality of semiconductor chips is put on a rotating table. Then, as shown in FIG. 4, by spin-coating an insulating material on the wafer 20 while rotating the table, an insulating layer 30 having a predetermined thickness is applied onto a surface of the wafer 20 as shown in FIG. 5.

Figure 6:
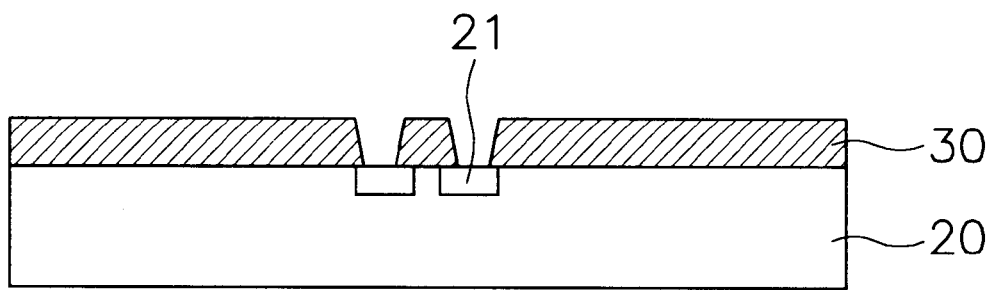
Figure 7:
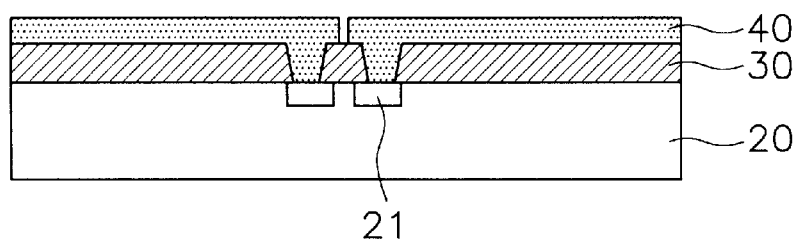

Thereafter, as shown in FIG. 6, by etching the insulating layer 30, bonding pads 21 are exposed. After a metal layer is deposited on the insulating layer 30 as shown in FIG. 7, the metal layer is patterned, whereby a metal trace 40 which is connected at one end thereof to the bonding pads 21, is formed. Thereupon, the wafer 20 is cut along a scribe line, whereby the wafer 20 is divided into a plurality of semiconductor chips.

Figure 8:
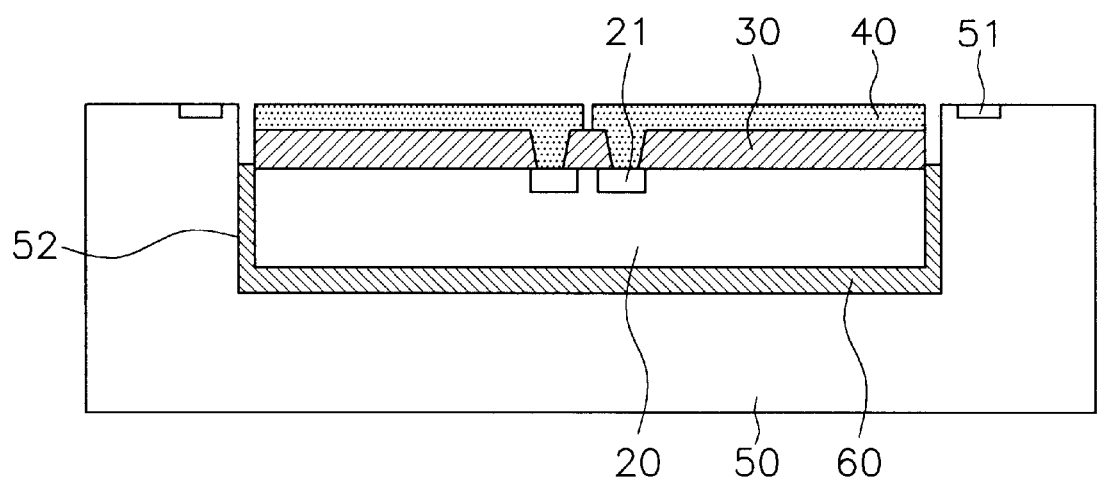

On the other hand, as shown in FIG. 8, a first recess 52 is defined on an upper surface of a board 50 on which upper surface electrode pads 51 are formed. The first recess 52 has a size capable of receiving therein one semiconductor chip 20. The one semiconductor chip 20 which is received in the first recess 52, is bonded to an inner wall of the board 50 which inner wall defines the first recess 52, using an adhesive 60. Then, the metal trace 40 and the electrode pads 51 are electrically connected with each other through metal wires 70.

Figure 10:
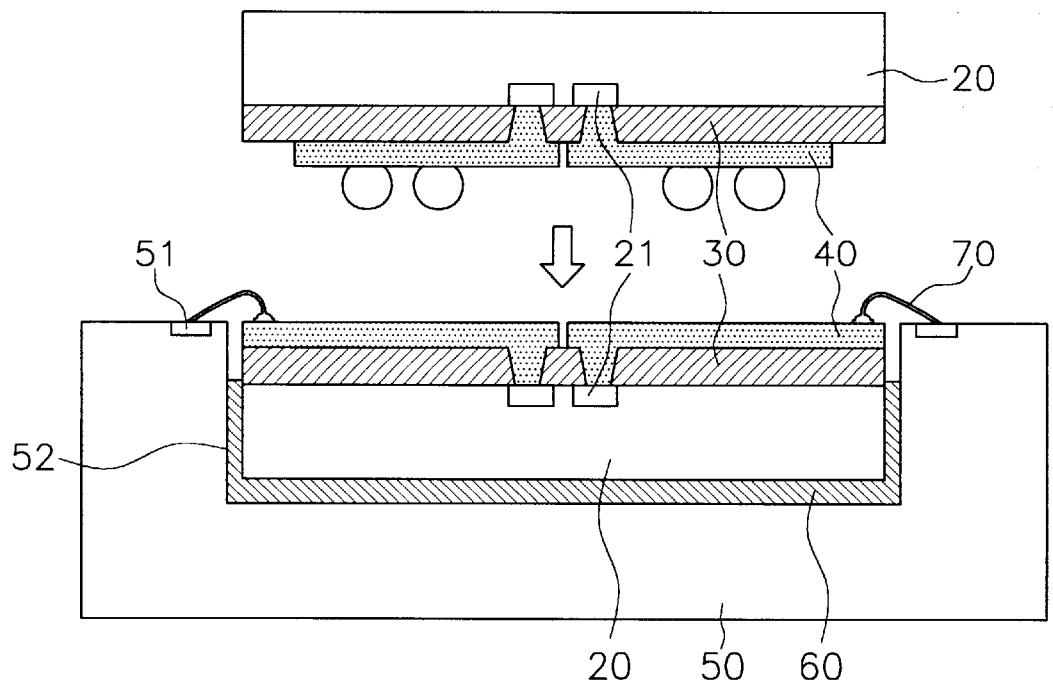
Figure 11:
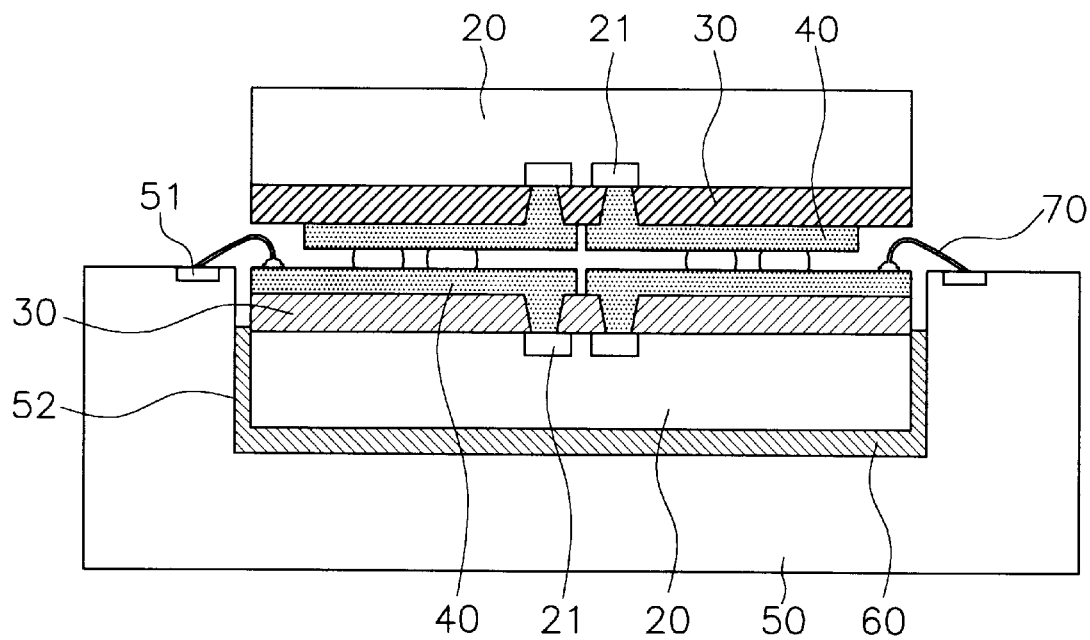

Then, as shown in FIGS. 10 and 11, after several solder balls 80 are mounted to a lower part of another semiconductor chip 20, that is, to a lower surface of the metal trace 40 of another semiconductor chip 20, the solder balls 80 are also mounted to the other end of the metal trace 40 of the lower semiconductor chip 20 which is received in the first recess 52. In this state, the upper semiconductor chip 20 is electrically connected to the lower semiconductor chip 20 through the solder balls 80, and the lower semiconductor chip 20 is electrically connected to the board 50 through the metal wires 70. Specifically, the solder balls 80 are, instead of being positioned between the semiconductor chip and the board as in the conventional art, located between two semiconductor chips 20 having the same thermal expansion rate, whereby it is possible to prevent a crack from being formed in the solder balls 80 due to a difference in a thermal expansion coefficient.

Figure 12:
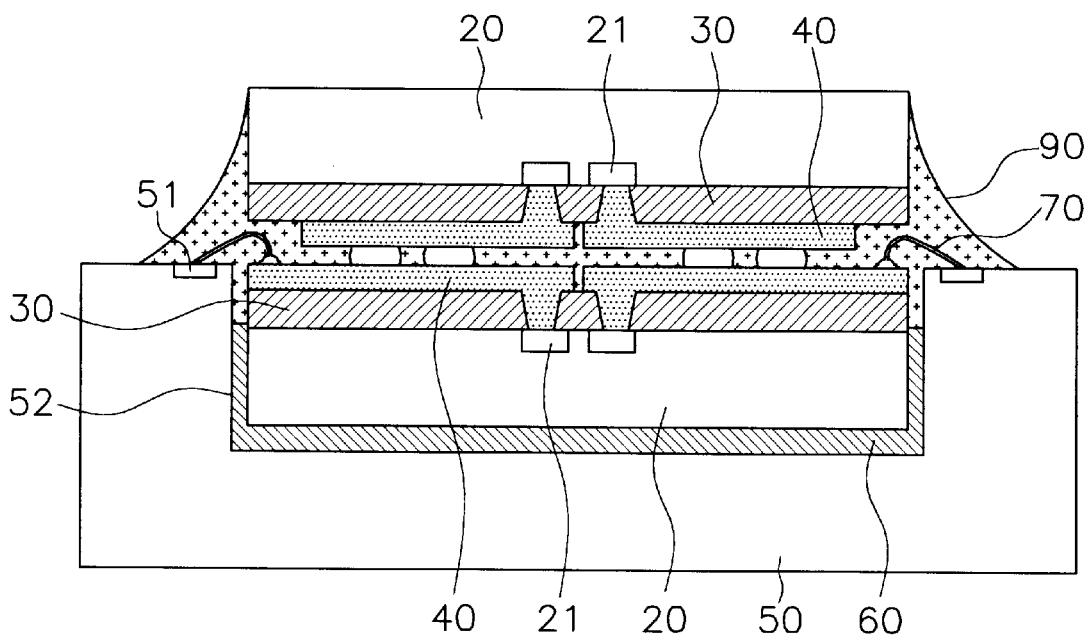
Figure 13:
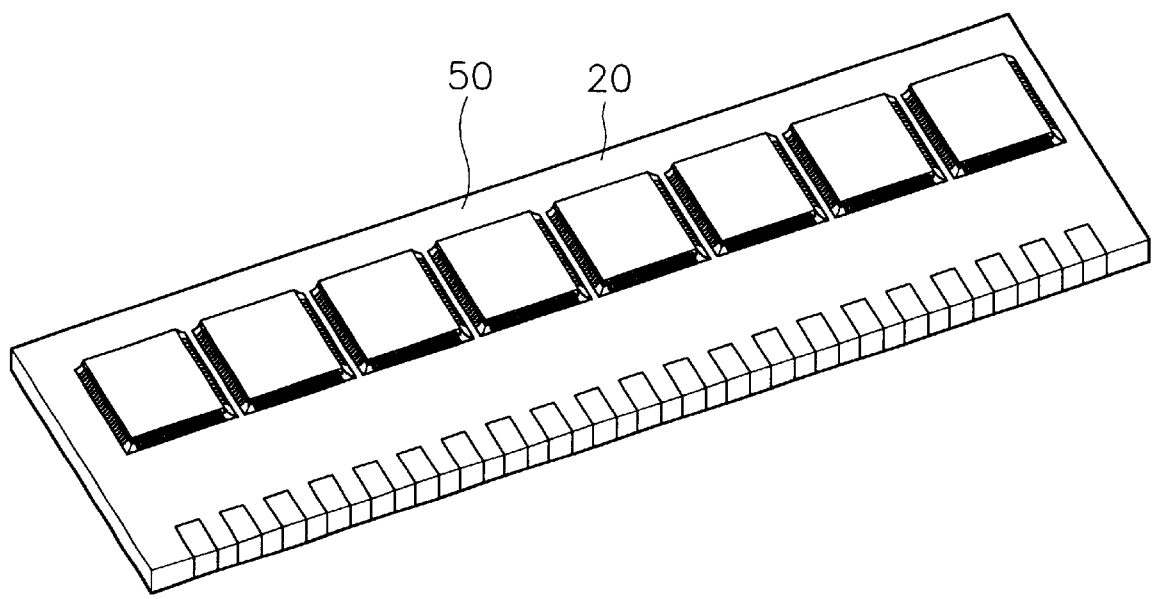

Finally, as shown in FIG. 12, as an encapsulate 90 is reflowed into between the stacked upper and lower semiconductor chips 20, the encapsulate 90 fully fills the first recess 52 and at the same time, molds both sides of the semiconductor chip 20 which sides correspond to wire bonding regions. FIG. 13 is a perspective view illustrating a state wherein eight semiconductor chips 20 which are stacked one upon another using the above-described method, are mounted to the board 50. A person skilled in the art will readily appreciate that, although eight semiconductor chips 20 are externally viewed, since other eight semiconductor chips are received in the first recesses 52, total sixteen semiconductor chips 20 are mounted to the board 50.

In the meanwhile, in a state as shown in FIG. 12, a heat sink (not shown) can be attached to a surface of the upper semiconductor chip 20 which is exposed out of the encapsulate 90.

Embodiment 2

Figure 9:
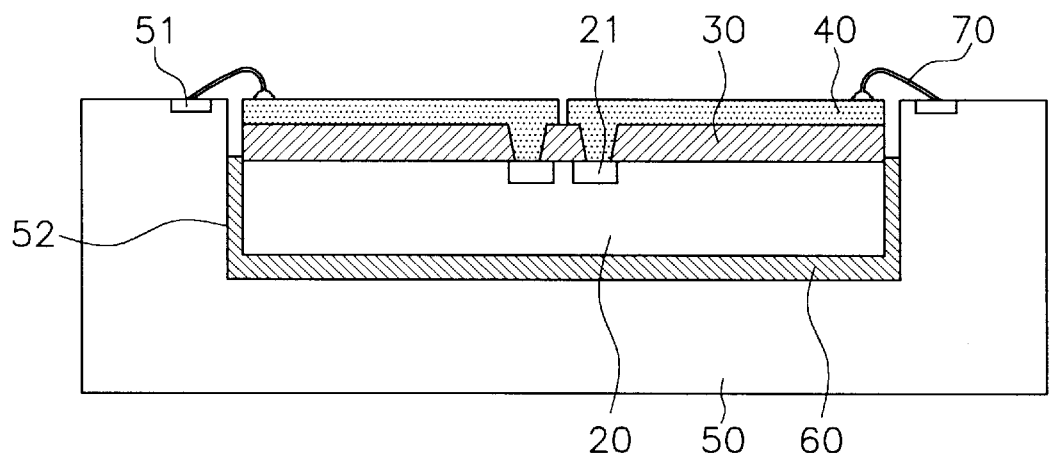
Figure 14:
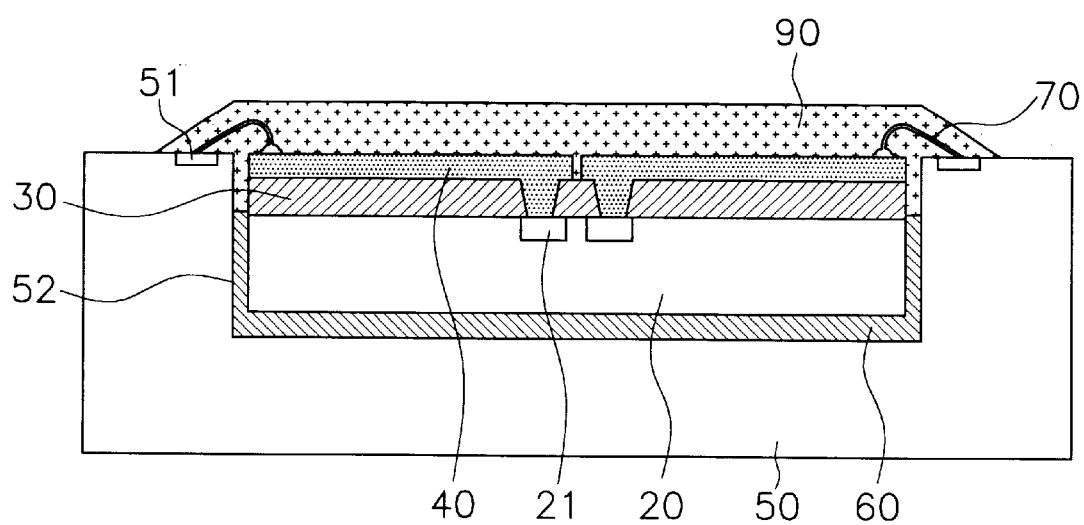
FIG. 14 is a cross-sectional view illustrating a chip size package and a memory module in accordance with a second embodiment of the present invention.

FIG. 14 is a cross-sectional view illustrating a chip size package and a memory module in accordance with a second embodiment of the present invention. In this embodiment, semiconductor chips are not stacked, and instead, only one package as shown in FIG. 9 is molded with the encapsulate 90.

Embodiment 3

Figure 15:
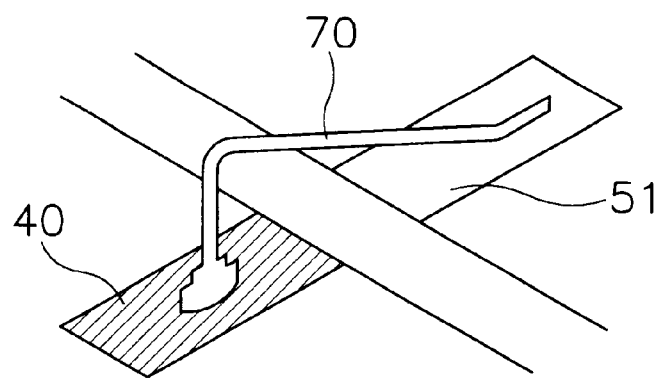
FIG. 15 is a perspective view illustrating a connecting fashion between electrode pads of a board and a metal trace which are used in the first embodiment.
Figure 16:
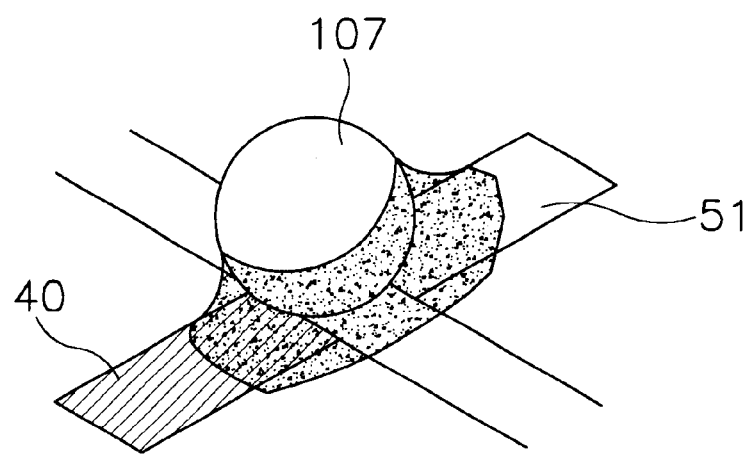
FIGS. 16 and 17 are perspective views illustrating other two connecting fashions in accordance with a third embodiment of the present invention.
Figure 17:
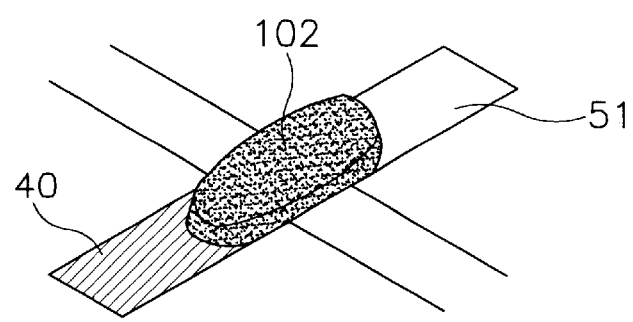

FIG. 15 is a perspective view illustrating a connecting fashion between electrode pads of a board and a metal trace which are used in the first embodiment; and FIGS. 16 and 17 are perspective views illustrating other two connecting fashions in accordance with a third embodiment of the present invention.

In the first embodiment, as shown in FIG. 15, the metal trace 40 and the electrode pads 51 are electrically connected with each other through the metal wires 70. Instead of using this method, methods as shown in FIGS. 16 and 17 can be used.

First, in the method as shown in FIG. 16, a solder ball 101 is used as an outside connection terminal. As can be readily seen from FIG. 16, after a conductive flux 100 is applied between the metal trace 40 and the electrode pad 51, the solder ball 101 is mounted to the conductive flux 100.

Next, in the method as shown in FIG. 17, after a solder paste 102 serving as the outside connection terminal is applied between the metal trace 40 and the electrode pad 51, the metal trace 40 and the electrode pad 51 are electrically connected with each other using a solder which is formed by a reflow process to have a bridge-shaped configuration.

Embodiment 4

Figure 18:
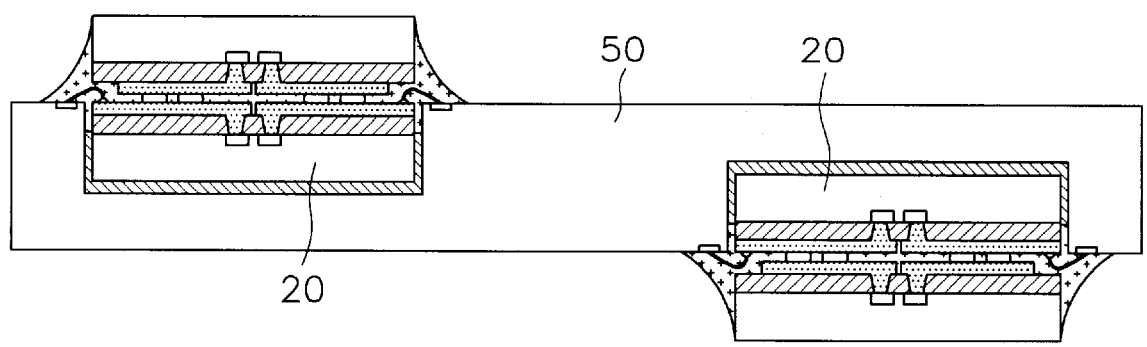
FIG. 18 is a cross-sectional view illustrating a memory module in accordance with a fourth embodiment of the present invention.

FIG. 18 is a cross-sectional view illustrating a memory module in accordance with a fourth embodiment of the present invention. As shown in FIG. 18, instead of placing stack packages on only one surface of the board 50, in the present embodiment, stack packages are placed on both surfaces of the board 50 to define a zigzag arrangement. By this, a board thickness is not increased and a memory capacity of the memory module can be increased.

Embodiment 5

Figure 19:
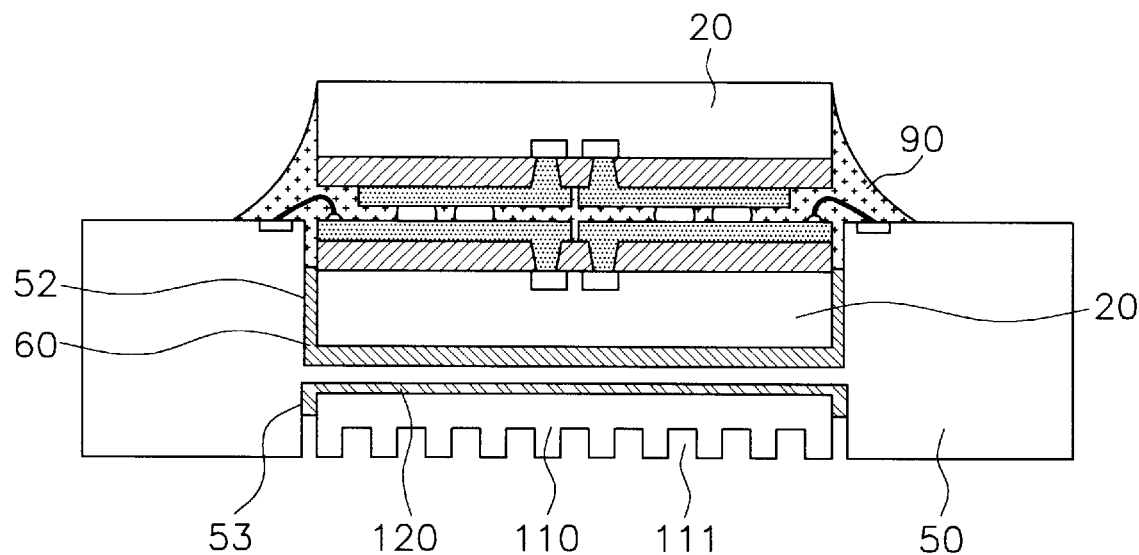
FIG. 19 is a cross-sectional view illustrating a memory module in accordance with a fifth embodiment of the present invention.

FIG. 19 is a cross-sectional view illustrating a memory module in accordance with a fifth embodiment of the present invention. As shown in FIG. 19, in this embodiment, a second recess 53 is defined on a lower surface of the board 50 on the upper surface of which the first recess 52 is defined. By bonding a heat sink 110, using an adhesive 120, to an inner wall of the board 50 which inner wall defines the second recess 53, heat generated inside the semiconductor chip 20 which is completely encapsulated by the encapsulate 90, can be easily dissipated through the heat sink 110. In order to accelerate the heat dissipation, it is preferred that a prominence and depression 111 be formed on a lower surface of the heat sink 110.

Embodiment 6

Figure 20:
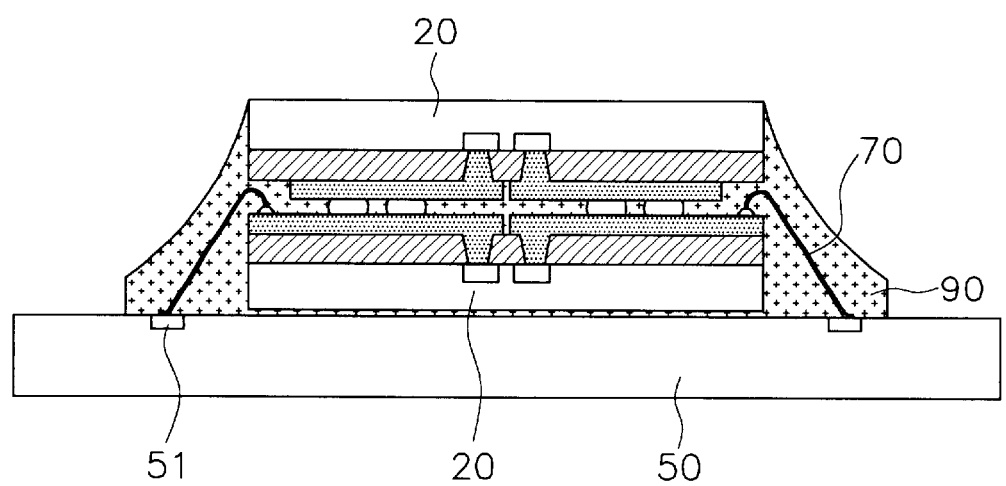
FIG. 20 is a cross-sectional view illustrating a memory module in accordance with a sixth embodiment of the present invention.

FIG. 20 is a cross-sectional view illustrating a memory module in accordance with a sixth embodiment of the present invention. As shown in FIG. 20, instead of defining the recesses, in this embodiment, upper and lower semiconductor chips 20 are directly molded by the encapsulate 90 in a state wherein they are placed on the board 50. In this method, because the recesses are not defined in the board 50, some of the expenses required for forming the board can be saved.

As described above, according to the present invention, advantages are provided in that, since metal traces are used in place of lead frames, signal interference can be minimized and costly laser equipment for fusing lead frames is not needed.

Also, because an encapsulate molds only sides of stacked semiconductor chips, by removing the encapsulate at the sides and disconnecting wire bondings, the stacked semiconductor chips can be easily detached from each other, whereby it is possible to prevent the entire semiconductor chips from being discarded when a flaw is induced in only one semiconductor chip.

Moreover, due to the fact that the upper semiconductor chip is exposed, a heat sink can be attached to an exposed portion of the semiconductor chip.

Specifically, by the fact that two semiconductor chips having the same thermal expansion rate are located up and down while being centered on solder balls, connection intensity of the solder balls is increased.

In addition, as the lower semiconductor chip of the stack package is received in a recess which is defined in the board, it is possible to prevent a thickness of the board from being remarkably increased by the stack package structure.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A chip size stack package comprising:

upper and lower semiconductor chips arranged in a manner such that their surfaces on which bonding pads are formed, are opposed to each other at a predetermined interval;

insulating layers applied to the surfaces of the upper and lower semiconductor chips on which surfaces the bonding pads are formed, in a manner such that the bonding pads are exposed;

metal traces respectively deposited on the insulating layers and connected to the bonding pads;

solder balls electrically connecting the metal traces with each other;

outside connection terminals coupled to the metal trace; and an encapsulate for molding sides of a resultant structure as a whole, in a manner such that the outside connection terminals are exposed sideward.

2. The chip size stack package as claimed in claim 1, wherein each of the outside connection terminals comprises a metal wire.

3. The chip size stack package as claimed in claim 1, wherein each of the outside connection terminals comprises a conductive flux which is applied to the metal trace and a solder ball which is mounted onto the conductive flux.

4. The chip size stack package as claimed in claim 1, wherein each of the outside connection terminals comprises a solder bridge which is connected to the metal trace.

5. The chip size stack package as claimed in claim 1, wherein a heat sink is attached to a surface of one of the upper and lower semiconductor chips which surface is exposed from the encapsulate.

6. A memory module comprising:

a board having a first surface on which electrode pads are formed and a first recess is defined;

upper and lower semiconductor chips one of which is received in the first recess of the board and bonded therein to the board, in a state in which the upper and lower semiconductor chips are arranged in a manner such that their surfaces on which bonding pads are formed, are opposed to each other at a predetermined interval;

insulating layers applied to the surfaces of the upper and lower semiconductor chips on which surfaces the bonding pads are formed, in a manner such that the bonding pads are exposed;

metal traces respectively deposited on the insulating layers and connected to the bonding pads;

solder balls electrically connecting the metal traces with each other;

outside connection terminals electrically connecting electrode pads of the board to the metal trace; and an encapsulate for molding connection regions of the outside connection terminals, the first recess and a space between the upper and lower semiconductor chips.

7. The memory module as claimed in claim 6, wherein each of the outside connection terminals comprises a metal wire.

8. The memory module as claimed in claim 6, wherein each of the outside connection terminals comprises a conductive flux which is applied to the metal trace and a solder ball which is mounted onto the conductive flux.

9. The memory module as claimed in claim 6, wherein each of the outside connection terminals comprises a solder bridge which is connected to the metal trace.

10. The memory module as claimed in claim 6, wherein a second recess is defined on a second surface of the board which surface is opposite to the first surface on which the first recess is defined, and a heat sink is received in the second recess and attached therein to the board.

11. The memory module as claimed in claim 6, wherein first recesses and electrode pads are defined and formed, respectively, on the first and second surfaces of the board in a manner such that a zigzag arrangement is obtained, whereby the stacked upper and lower semiconductor chips are located on the first and second surfaces of the board in a manner such that a zigzag arrangement is also obtained.

* * * * *